US009223913B2

(12) United States Patent
Friedberg et al.

(10) Patent No.: US 9,223,913 B2
(45) Date of Patent: Dec. 29, 2015

(54) METHOD FOR THE ACOUSTIC ANALYSIS OF A BODY AND A SYSTEM FOR THE EXECUTION OF SUCH A METHOD

(75) Inventors: Andreas Friedberg, Hamburg (DE); Uwe Juergens, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 334 days.

(21) Appl. No.: 13/288,059

(22) Filed: Nov. 3, 2011

(65) Prior Publication Data

US 2012/0116736 A1    May 10, 2012

Related U.S. Application Data

(60) Provisional application No. 61/409,976, filed on Nov. 4, 2010.

(30) Foreign Application Priority Data

Nov. 4, 2010    (DE) .......................... 10 2010 043 368

(51) Int. Cl.
*G06G 7/48*    (2006.01)
*G06F 17/50*    (2006.01)

(52) U.S. Cl.
CPC ........ *G06F 17/5018* (2013.01); *G06F 17/5095* (2013.01)

(58) Field of Classification Search
CPC .......................... G06F 17/5095; G06F 17/5018
USPC ........................................................ 703/6, 7
See application file for complete search history.

(56) References Cited

U.S. PATENT DOCUMENTS

| 6,179,086 B1* | 1/2001 | Bansemir et al. ............. 181/292 |
| 6,687,659 B1* | 2/2004 | Shen ................................ 703/2 |
| 7,430,910 B2* | 10/2008 | Gleine ........................... 73/583 |
| 8,336,804 B2* | 12/2012 | Hoetzeldt et al. ............. 244/1 N |
| 2006/0037809 A1* | 2/2006 | Fuller et al. ................... 181/207 |
| 2009/0105996 A1* | 4/2009 | Rassaian et al. ................... 703/2 |
| 2010/0036649 A1* | 2/2010 | Rassaian et al. ................... 703/2 |
| 2011/0284689 A1* | 11/2011 | Thomas et al. ............... 244/1 N |
| 2012/0119023 A1* | 5/2012 | Moore et al. .................. 244/1 N |

OTHER PUBLICATIONS

Stephan Tewes (("Active Trim Panel Attachments for Control of Sound Transmission through Aircraft Structures", Munich University of Technology, 2005).*

(Continued)

*Primary Examiner* — Omar Fernandez Rivas
*Assistant Examiner* — Iftekhar Khan
(74) *Attorney, Agent, or Firm* — Carter, DeLuca, Farrell & Schmidt, LLP

(57) ABSTRACT

A system and method for the acoustic analysis of a body, in particular a fuselage structure of an aircraft, is provided including: inputting data for geometry, material, boundary conditions and acoustic parameters of the body, generating a body idealized in terms of its structural mechanics, and a cavity simulating the interior of the body, on the basis of the data inputted as a numerical body model, inputting the geometry of the body with a pattern of nodes and the generation of finite elements, stimulating an acoustic loading case by subjecting the body model to at least one sound pressure wave at a defined frequency, analyzing the effect of the sound pressure wave on the body model, and outputting a sound reduction index (R) for the body with reference to that frequency.

10 Claims, 10 Drawing Sheets

(56) References Cited

OTHER PUBLICATIONS

Buehrle et al. (Finite Element Model Development for Aircraft Fuselage Structures, International Modal Analysis Conference, 2000).*
Bilong Liu (Acoustical characteristics of aircraft panels, The Royal Institute of Technology, Stockholm, 2006).*
Bergdahl et al. ("Handbook on Data Quality Assessment Methods and Tools", European Commission, 2007).*
Thacker et al. ("Concepts of Model Verification and Validation", Los Alamos National Laboratory, 2004).*
ANSYS Project report—12.0.1 Release—2009, pp. 1-79.*
German Office Action dated Apr. 21, 2015, issued in German application No. 10 2010 043 368.3.

* cited by examiner

METHOD FOR THE ACOUSTIC ANALYSIS OF A BODY AND A SYSTEM FOR THE EXECUTION OF SUCH A METHOD

TECHNICAL FIELD

The invention concerns a method for the analysis of the acoustic properties of a body, in particular of a fuselage structure of an aircraft, and a system for the execution of such a method.

BACKGROUND

For the numerical calculation of the acoustic properties of bodies, in particular of a fuselage shell or a fuselage structure of an aircraft, the first step is usually to generate manually a numerical body model. In a second step the model is subjected to acoustic loadings. In a third step numerical calculations are undertaken in accordance with the finite element method (FEM calculations). Finally, in a fourth step the results are evaluated. The first step in particular is extremely time-intensive and, by virtue of the manual inputs, very susceptible to errors, since in addition to the manual generation of the model the checking of the model generated is also undertaken manually. Moreover any alteration is the cause of a significant amount of corrective effort. Depending on the complexity of the model and the number of loading cases several days are often required for the first step, whereas the second, third and fourth steps can each be executed within a few hours. With regard in particular to studies of geometric parameters in the early stages of product development, in which modifications are inevitably made to the body model, long response times arise in the assessment of these parameters.

The object of the invention is to create a method for the acoustic analysis of a body, which removes the above-cited disadvantages, and with which reactions to any modifications to the body under investigation can be flexible and in a short timescale, and a system for the execution of such a method.

SUMMARY

The object is achieved by means of a method with the features of Claim 1, and by means of a system with the features of Claim 9.

In an inventive method for the acoustic analysis of a body, in particular a fuselage structure of an aircraft, data are inputted regarding the geometry, material, boundary conditions and acoustic parameters of the body model. In a second step a body, idealised in terms of its structural mechanics, and a cavity simulating the interior of the body, are generated on the basis of the data inputted as a numerical model. For this purpose the geometry of the body is firstly registered with a pattern of nodes and in a second step the finite elements are generated. Next an acoustic loading case is simulated by subjecting the idealised body, i.e. the body model, to at least one sound pressure wave at a defined frequency. The effect of the at least one sound pressure wave on the body model is then analysed and finally a sound reduction index is outputted for the body with reference to that frequency.

By means of the inventive method it is possible to reduce significantly the time required for the generation of a body model, and also for alterations to the model, from several days to a few hours. An automated generation of the model is enabled from predefined parameters for geometry and materials. Furthermore, checking of the model is not undertaken manually, but rather is automated, so that the checking effort is also much reduced and in addition the susceptibility to errors is reduced. Checking of the input data is executed within the model generation process, thereby ensuring that the model does not have any geometric inconsistencies. The reduced time required for generating and checking the model allows more focus on the significance of the results and thus a more systematic evaluation of the acoustic analysis. Moreover, the method allows a fineness of mesh of the body model that is matched to the particular acoustic problem so as to ensure an optimal quality of analysis. Furthermore, both isotropic and anisotropic body materials, such as composite materials, can be modelled. In addition, a parallelisation of the overall process is possible. The inventive method also allows an integration of any other form of loading of an acoustic, static, or structural dynamic kind, so that structural mechanics requirements can also be investigated.

In a preferred example of the method the idealised body is subjected to a sound field of a defined frequency band from a multiplicity of sound sources, each of which transmits a sound pressure wave at a frequency. Here for purposes of obtaining the most realistic figure possible it is preferable if the sound sources are arranged spherically around the body model at random angles such that a diffuse sound field is generated, such as is typically used as a reference sound field for the acquisition of sound reduction indices.

In one example of embodiment parameters such as body radius, wall thickness, and also the type, orientation, dimensions, and separation distances of stiffening elements are inputted as geometric data for the body.

As material data parameters are defined such as density, stiffnesses, layer thickness and, in the case of anisotropic body materials, the appropriate composite structure.

As acoustic data parameters are defined for the cavity, which represents the air in the interior of the body model, characteristic values for the atmosphere external to the body, characteristic values for the insulation material, the frequency bandwidth for which the sound reduction index is to be determined, the number and distances of the sound sources from the body model, and the distance from the body model to the point in the cavity at which the evaluation of the sound transmission is undertaken.

The numerical analysis is undertaken as a direct frequency response calculation. Analyses of this type conform to a standard for the determination of sound transmission properties and lead to a realistic result.

The sound reduction index is determined from the sound intensity distribution ratio between the sound incident onto the body and the sound radiated into the cavity.

For the complete documentation of the idealised body and the assessment of the numerical quality of the model and its structural mechanics properties a technical report and a quality report are issued; these contain the mechanical properties of the body and also the numerical and geometric characteristic values of the model.

For the execution of an inventive method for the generation of the acoustic analysis of a body in accordance with one of the preceding claims, an inventive system has an input module for the input of data, a nodes or geometry module for the generation of a body model idealised in terms of its structural mechanics, and a cavity simulating the body interior, an elements module for the definition of the finite elements of the body and the cavity, and also for material assignment, a loads module for the simulation of an acoustic loading case in the form of a diffuse sound field, a numerical analysis by means of the finite element method, and a results module for the evaluation of results and the output of a sound reduction index.

Other advantageous examples of embodiment of the invention are the subject of further subsidiary claims.

BRIEF DESCRIPTION OF THE DRAWINGS

In what follows a preferred method and a preferred system of the invention are elucidated in more detail with the aid of schematic representations. Here.

DETAILED DESCRIPTION

Figure 1:
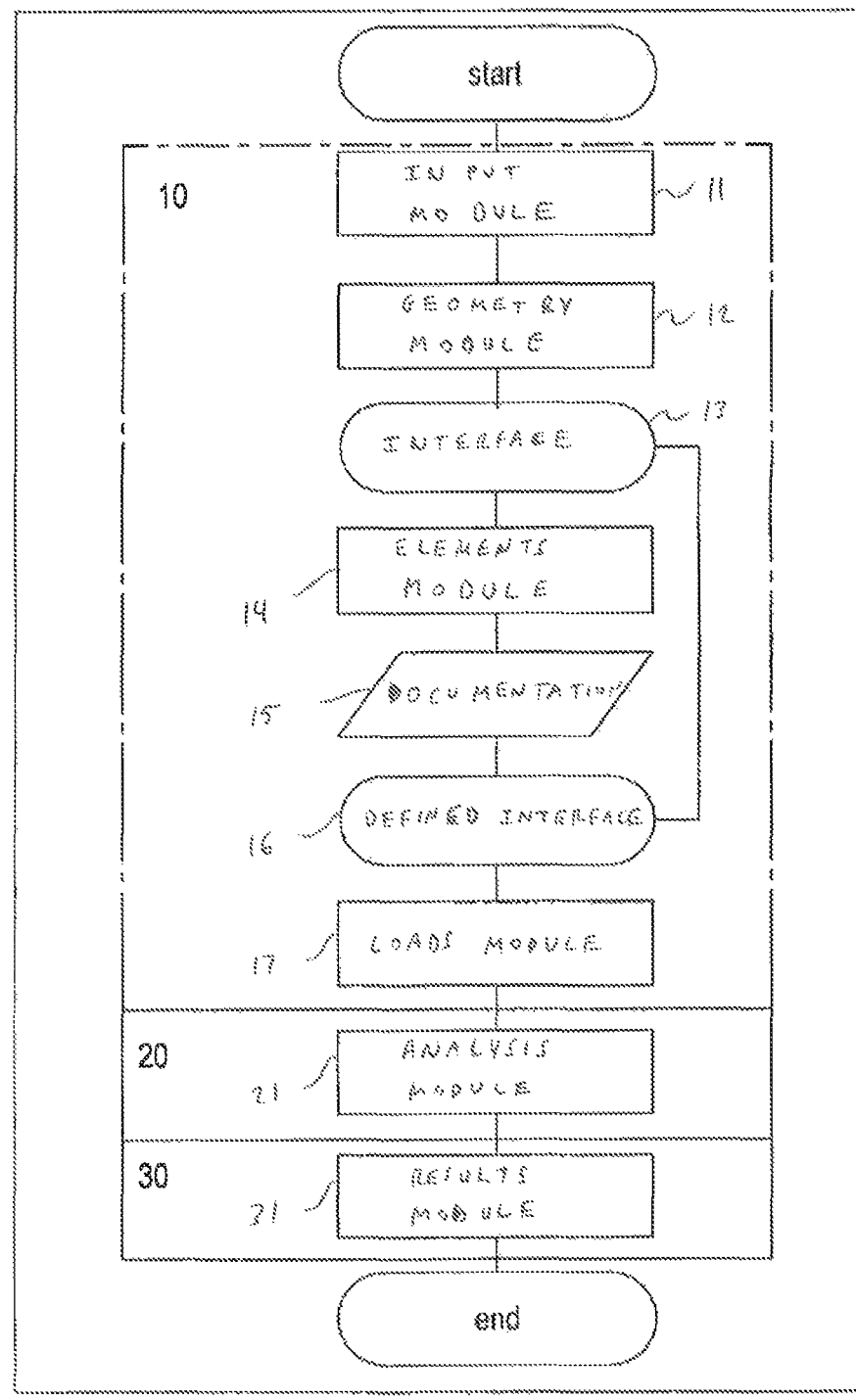
FIG. 1 shows a flow diagram for the execution of an inventive acoustic analysis of a body.

In accordance with the flow diagram in FIG. 1 a preferred example of embodiment of an inventive method for the acoustic analysis of a body 2 is divided into a body model generation and loading phase 10, a calculation phase 20, and a results phase 30.

Figure 6B:
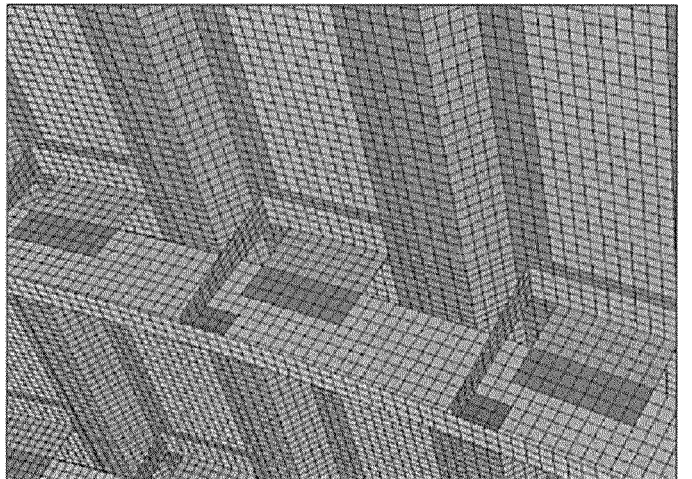
FIG. 6b shows a detail from FIG. 6a, FIG. 7 shows the structure in principle of a diffuse sound field.
Figure 6A:
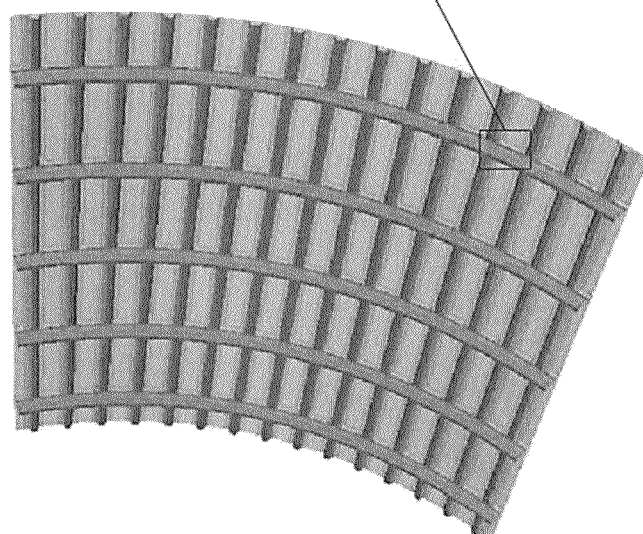
FIG. 6a shows a mesh model of the fuselage shell.

In general the generation phase 10 has three sub-steps, wherein in the first sub-step the geometric boundary conditions of the body model 4 and the frequency band to be investigated are coordinated with the fineness of the mesh, in order hence to generate a finite element model 4 (for the FE model, see FIGS. 6a and 6b). In a second sub-step all essential mechanical properties of the FE model 4 are documented in a report, which can be called upon for purposes of a structural mechanics assessment. In addition all numerical and geometric parameters of the FE model 4 are documented in a further report. This documentation forms the basis of a quality management system, and can be supplemented with further quality requirements. The third sub-step integrates an automatic acoustic loading case, matched to the FE model 4, which fulfills the requirements of a diffuse sound field.

In the calculation phase 20 all the control and input data are generated that are necessary to bring about a solution via the finite element method within the framework of a direct frequency response calculation. The selection of the particular finite element solver (FE solver) is independent of the method as long as the FE solver can implement structural dynamic analyses.

In the results phase 30 a sound reduction index R of the investigated body is outputted as a result over the selected frequency band; this enables an acoustic and structural dynamic assessment of the body to be made.

Figure 3:
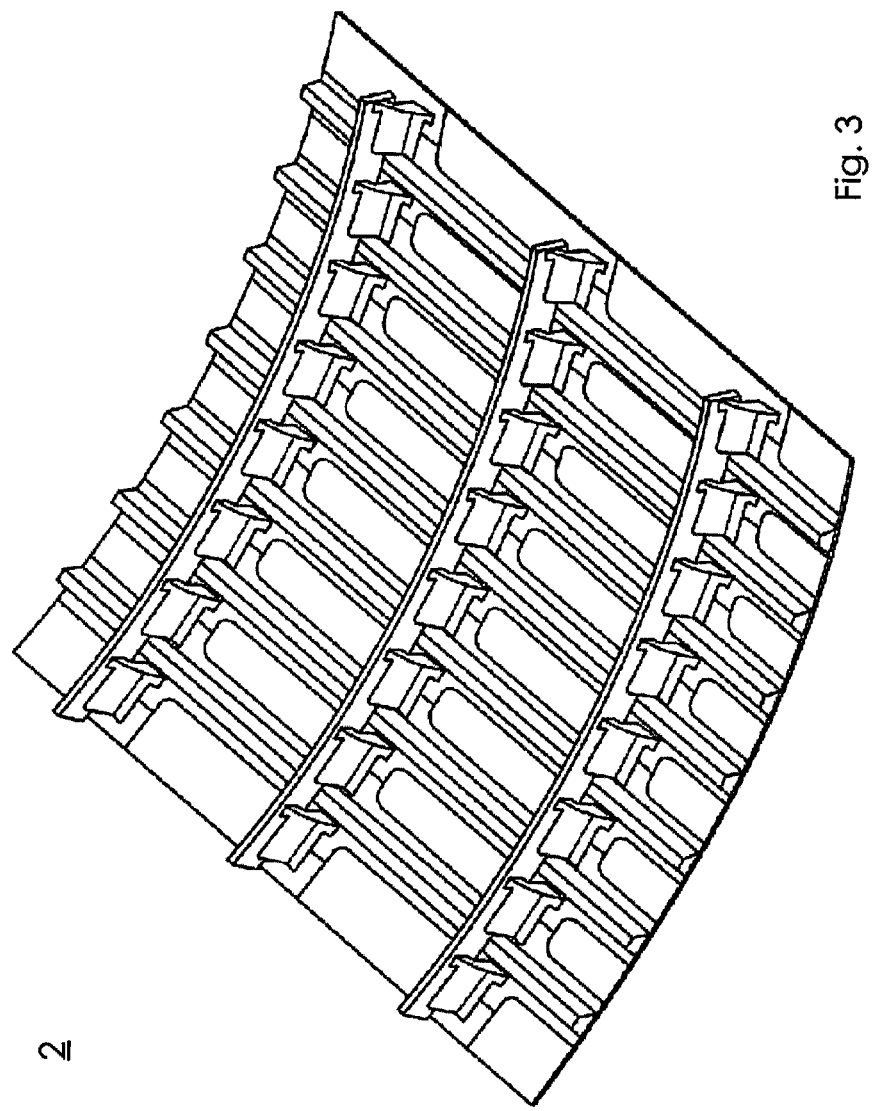
FIG. 3 shows the body represented as an idealised fuselage shell.

In what follows a more detailed elucidation is presented of the inventive method and an inventive system 1 for the execution of the method on the basis of a fuselage shell 2 of an aircraft (see FIG. 3).

As shown in FIG. 1, the system 1 has an input module 11 for the input of data, a geometry or nodes module 12 for the generation of the body 4 idealised in terms of its structural mechanics, and a cavity simulating a cabin interior, an elements module 14 for the definition of elements of the body 2 and the cavity, and also for the assignment of materials to the elements, a loads module 17 for the simulation of an acoustic loading case, an analysis module 21 for the calculations, and a results module 31 for the evaluation and output of the sound reduction index R.

Figure 2:
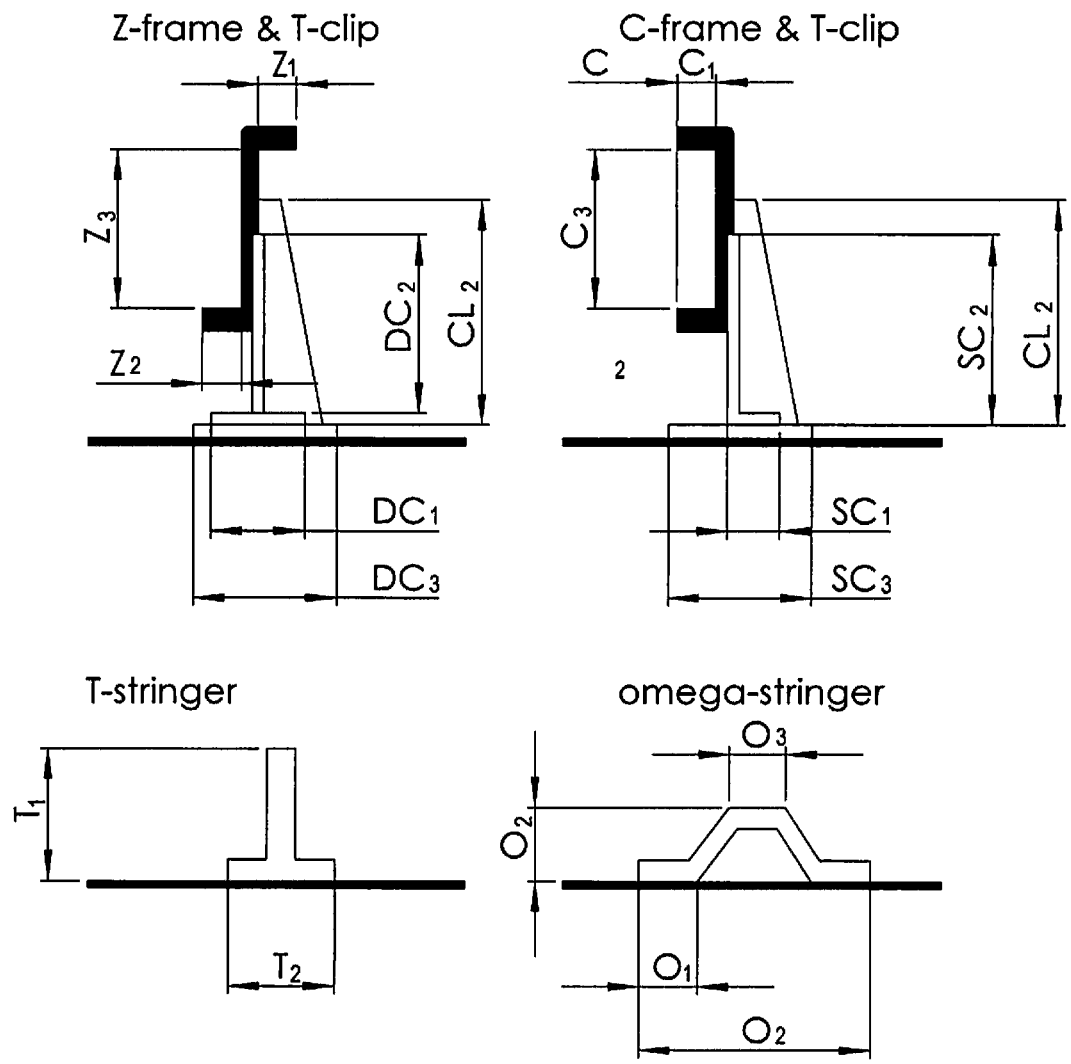
FIG. 2 shows the definition of the dimensions of longitudinal and transverse stiffeners of the body.

To begin with the geometry of the fuselage shell 4 to be idealised is firstly defined during the body model generation and loading phase 10 by means of the input module 11. Here global parameters such as fuselage shell radius, stringer and frame separation distance and also the various types of shell components and their dimensions are defined, wherein depending on the structural specification they are either resolved as individual components or are idealised as an integral module. FIG. 2 shows the definition in principle of the dimensions of longitudinal and transverse stiffeners.

The definition of the meshing of the geometry is then undertaken. Here two meshing methods are available for selection. Thus the meshing of the geometry can be undertaken in a user-defined manner in terms of numbers of elements per geometric edge, or it can be automated as a function of a minimum number of elements per bending wavelength, which ensues from the frequency band that is being investigated.

Following on from the meshing process the material properties are stored, such as density and stiffnesses and also, in the case of anisotropic materials, layer thickness and structure for each individual structural component.

After the geometric data have been inputted all the items of information necessary for the generation of a finite element calculation (FE calculation) are available. In order that an acoustic analysis can be undertaken, the following acoustic specifics are additionally defined: the properties of the cavity, which represents the air in the cabin interior, and also the characteristic values for the external atmosphere, the characteristic values for the insulation material between the fuselage outer skin and the cabin, the frequency band in which the acoustic analysis is to be undertaken, the number and distances of the sound sources from the fuselage outer skin for the purpose of load generation, and the distance from the fuselage shell in the cavity at which the evaluation of the sound transmission is undertaken.

Global process parameters are then defined. These include on the one hand the name to be allocated to the calculation, and on the other hand the particular solver, for example a NASTRAN solver, which is called upon for the calculation. Moreover the translational and rotational mountings at the outer edges of the fuselage shell 2 are defined for the FEM calculation. In addition a cabin differential pressure can be taken into account for the sound transmission characteristics.

When the input of the above data is complete, the nodes module 12 is called up. Here edges and surfaces are derived from the generically defined geometry. In accordance with the so-called "method of element number calculation" the element lengths are calculated for Method 1, and hence the resulting FE node coordinates are derived.

If Method 2 is selected a subroutine automatically calculates the element lengths to the extent that for the selected frequency range it is ensured that at the highest frequency a specified number of elements per bending wavelength $\lambda$ are defined in accordance with the determining equation:

$$\lambda = \frac{\sqrt{\omega} \cdot \sqrt[4]{\frac{D}{m_f}}}{f}$$

This automatically ensures that the FE model 4 is matched to the boundary conditions of the acoustic analysis. All possible fuselage component surfaces can be selected as a reference, such as e.g. the centre of the skin field, or the web of a frame. In this mesh definition the skin and the frame are so-called master components, on the basis of which the definitions of the stringer elements, i.e. the clip and cleat elements, are determined. Here "clip and cleat elements" are understood to be the fittings connecting the frames to the fuselage shell inner skin and the stringers.

Furthermore the nodes module 12 contains an algorithm for purposes of ensuring geometric compatibility. If as a result of the inputs a geometrically impermissible structure of the fuselage shell 2 is defined, for example, in which a stringer penetrates through the frame, this algorithm detects the penetration, terminates the method and describes the error in a quality report.

In addition to the idealisation of the fuselage shell 2 in terms of its structural mechanics, the nodes of the cavity are also calculated. In this process the nodes are defined for the components such that the elements created are as square as possible. The results for the creation of near-square elements in accordance with an n-times bending wavelength are summarised in a geometry report. The node coordinates as well as the information concerning the calculated edges and surfaces are transferred via a defined interface 13 to the elements module 14.

Figure 4:
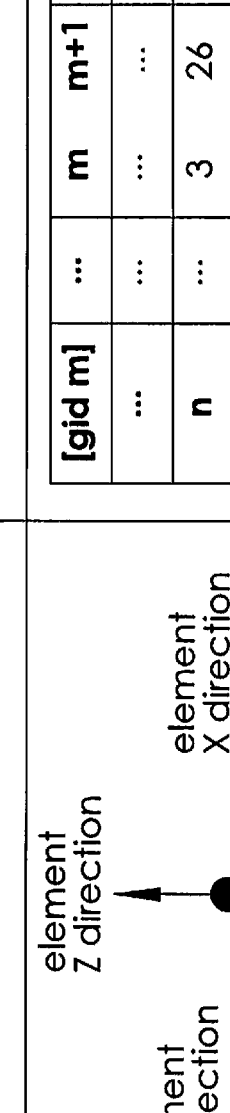
FIG. 4 shows the definition and orientation of the skin elements of the fuselage shell.

The elements module 14 firstly assigns identities (IDs) to the nodes. For purposes of element definition the nodes are combined into groups of four by means of a meshing algorithm such that a finite element is clearly defined and oriented. The element IDs shown in FIG. 4 are assigned by the meshing algorithm to these elements.

Figure 5:
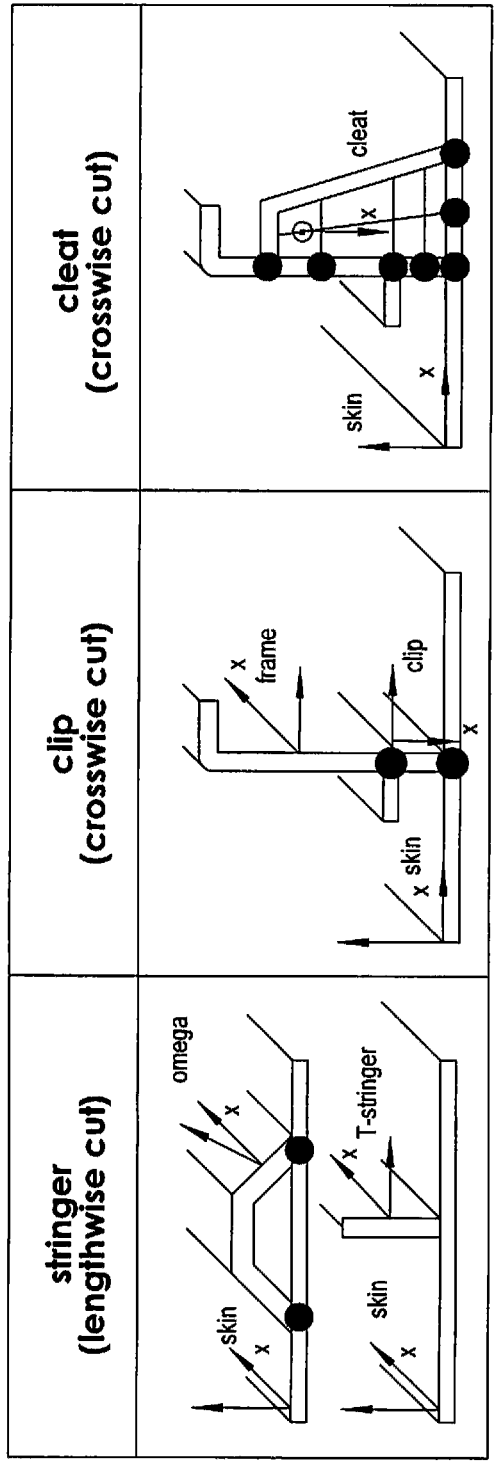
FIG. 5 shows the alignment of the stiffening elements of the fuselage shell.

By means of a further algorithm the material properties are calculated from the input data and assigned to the elements. In the case of anisotropic materials such as composite materials, for example carbon fibre reinforced plastics, in particular, the orientation of the material and element is of significance; this is determined in an automated manner for the respective element. An exemplary orientation of the elements for individual fuselage components such as stringers, clips and cleats is shown in FIG. 5.

After the fuselage shell model 4 has been meshed, the same procedure of element definition and material assignment is undertaken for the cavity.

Thereupon the stiffness and material charts and also the mounting conditions in terms of limitation of the degrees of freedom on the edge nodes of the fuselage shell model 4 are generated in accordance with the input data for the numerical analysis.

The analysis file is then written out, for example, in a format that can be processed by a Nastran FE solver. At this point in time a finely meshed FE model 4 of the fuselage shell 2, shown in FIGS. 6a and 6b, is generated, which is also suitable for detailed investigations of the structural mechanics.

Finally a report is generated in the elements module 14 for the documentation 15 of the structural mechanics properties of the model 4.

In summary the following items of documentation 15 are made available from the nodes module 12 and the elements module 14: analysis definition for the FEM solver, FEM idealisation of the fuselage shell 2, FEM idealisation of the cavity, summary of the inputted data, documentation of the element side ratios and the bending wavelengths per laminate for purposes of safeguarding the numerical quality, and also documentation of the structural properties of the fuselage shell 2 for the assessment of the mechanical properties.

The geometry report contains in one section a detailed documentation of the side length ratio of the elements implemented, as well as the number of elements per geometric edge. In another section the report contains a comparison of the element lengths achieved with the acoustically required element lengths.

An exemplary structural mechanics report contains the number of FEM nodes and elements, from which it is possible to estimate the length of time taken for the FEM calculation. Furthermore the thicknesses, the cross-sectional surface areas, the specific and normalised weights, the moduli of elasticity, the axial stiffness and bending stiffness as well as the laminate properties in accordance with multi-layer theory (classical laminate theory or CLT) are described for each fuselage component.

Figure 7:
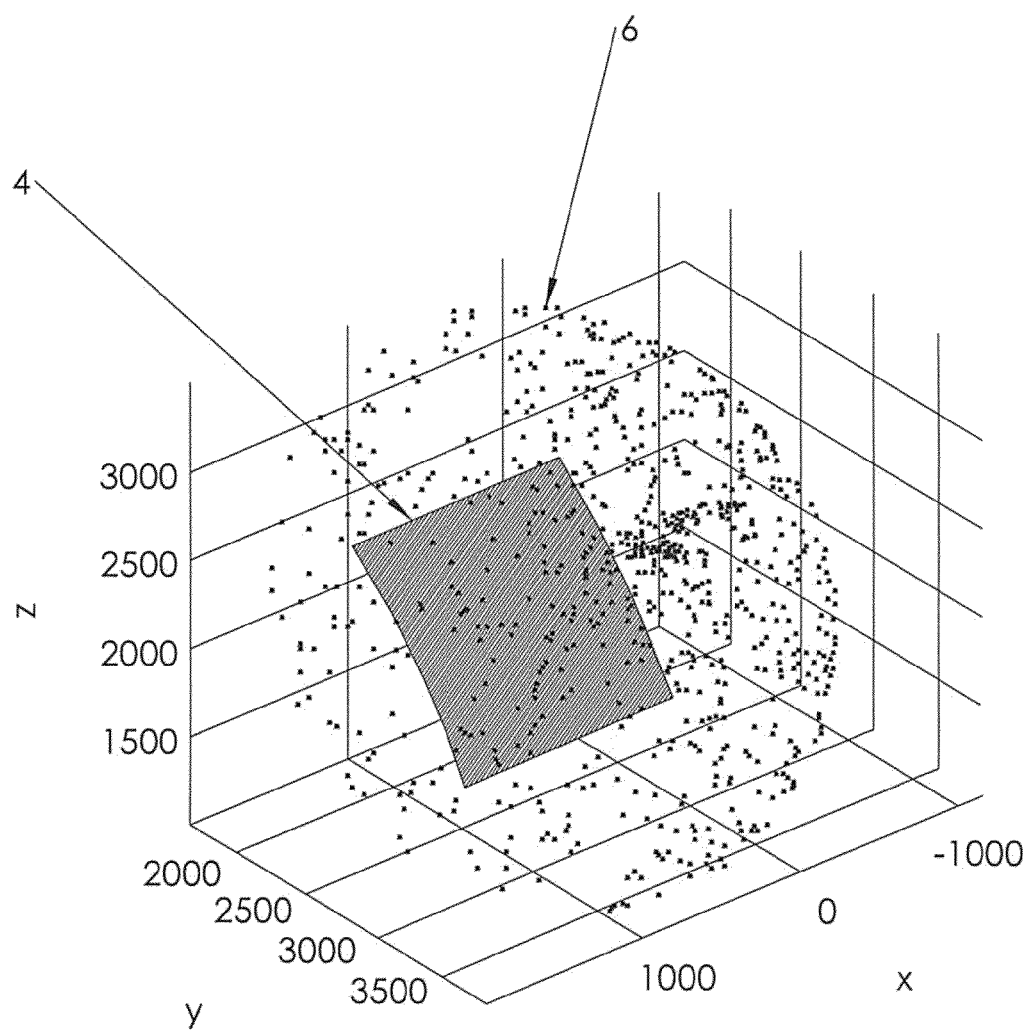

The loads module 17 is then called up via a defined interface 16, which is directly connected 18 with the interface 13, for the simulation of an acoustic loading case. Here, as shown in FIG. 7, a multiplicity of sound sources 6, represented as points, are spherically arranged at random angles around the body model 4 of the fuselage shell 2. These transmit plane sound pressure waves per frequency of a pre-defined frequency band with a random phase displacement. The resulting frequency-dependent pressure distribution on the fuselage shell outer skin is calculated from the acoustic loading of the diffuse sound field so defined.

The calculation phase 20 then begins. In this the acoustic analysis is executed by means of the analysis module 21 on the basis of the FE method, with the use of an FE solver for direct frequency response calculations. Here the analysis can either be initiated directly from the method, or manually. The numerical analysis calculates a frequency-dependent sound pressure distribution in the cavity via the fluid-structure coupling between the idealised fuselage shell 4 and the cavity, which represents the cabin interior.

Figure 8:
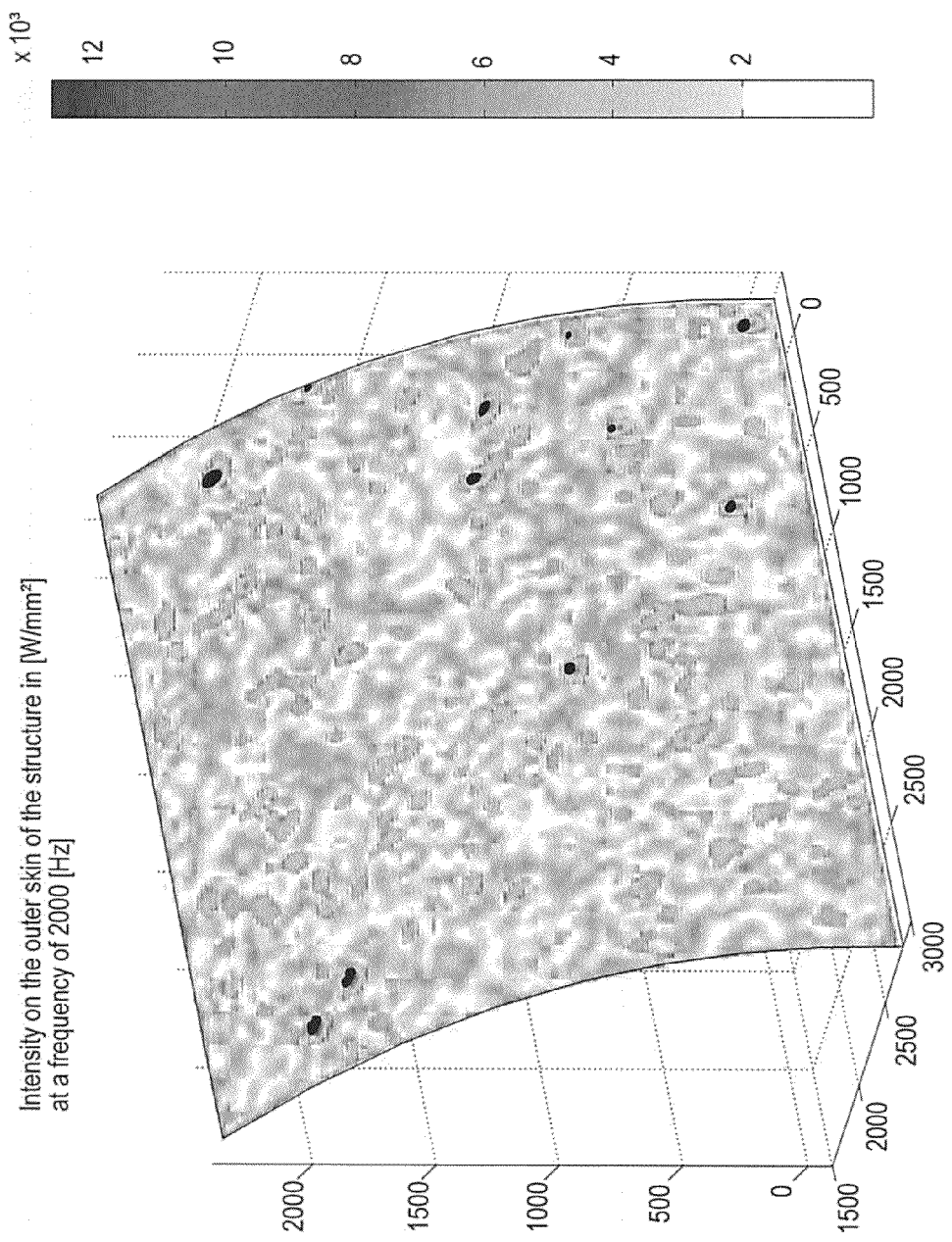
FIG. 8 shows a pressure distribution of the sound incident onto the fuselage shell.
Figure 9:
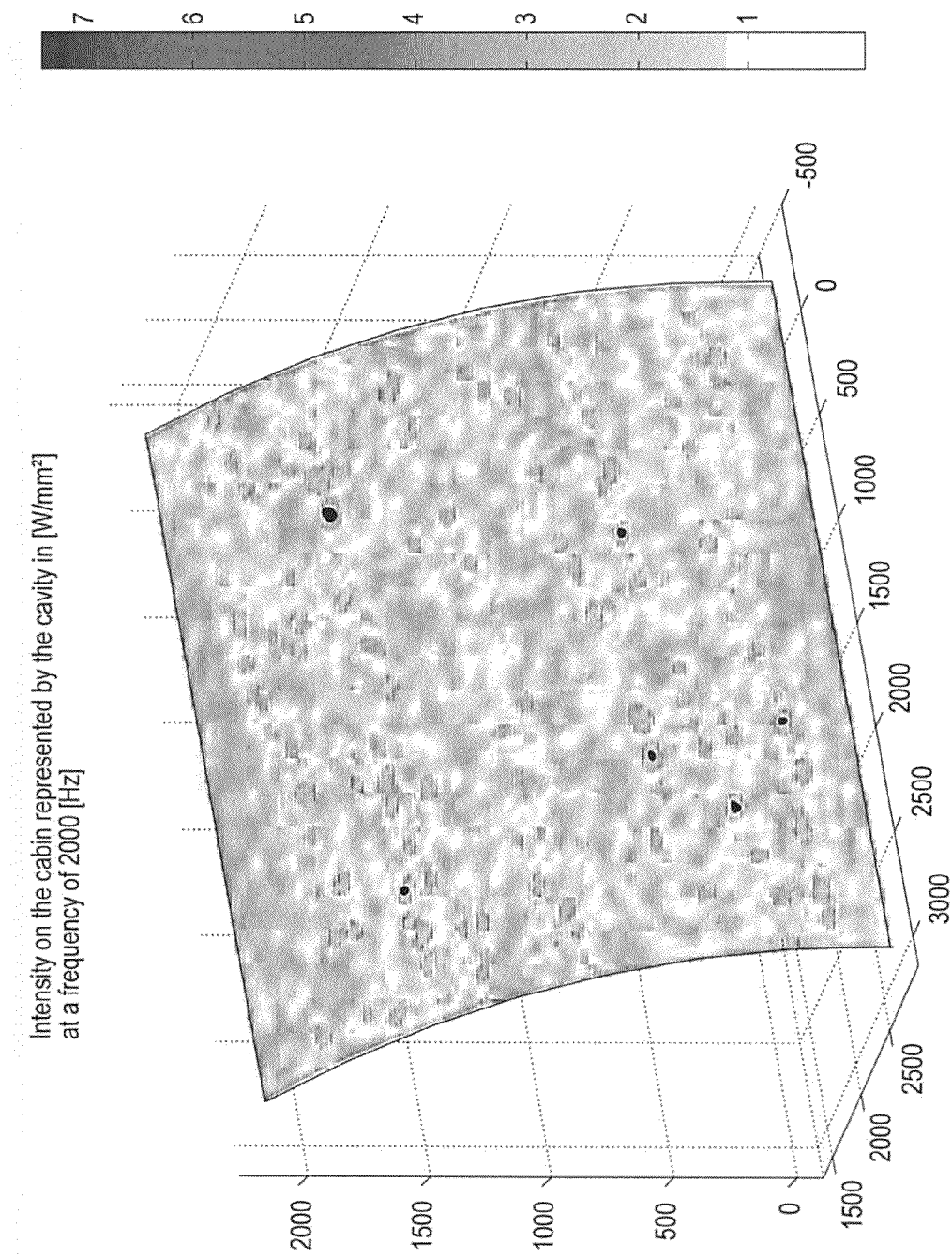
FIG. 9 shows a pressure distribution of the sound radiated from the fuselage shell into the cavity.

Finally the results phase 30 is executed. The results module 31 is called up and an evaluation of the FEM simulation is undertaken. Here, as shown in FIG. 8, an incident sound intensity $J_1$ is firstly derived from the pressure distribution on the fuselage shell outer skin. Then, as shown in FIG. 9, the radiated intensity $J_2$ is determined from the pressure distribution in the cavity. Via the logarithmic ratio of incident to radiated intensity a sound reduction index R is determined from the equation $R=10 \log (J_2/J_1)$; this provides the acoustic characteristic of the fuselage shell 2.

Figure 10:
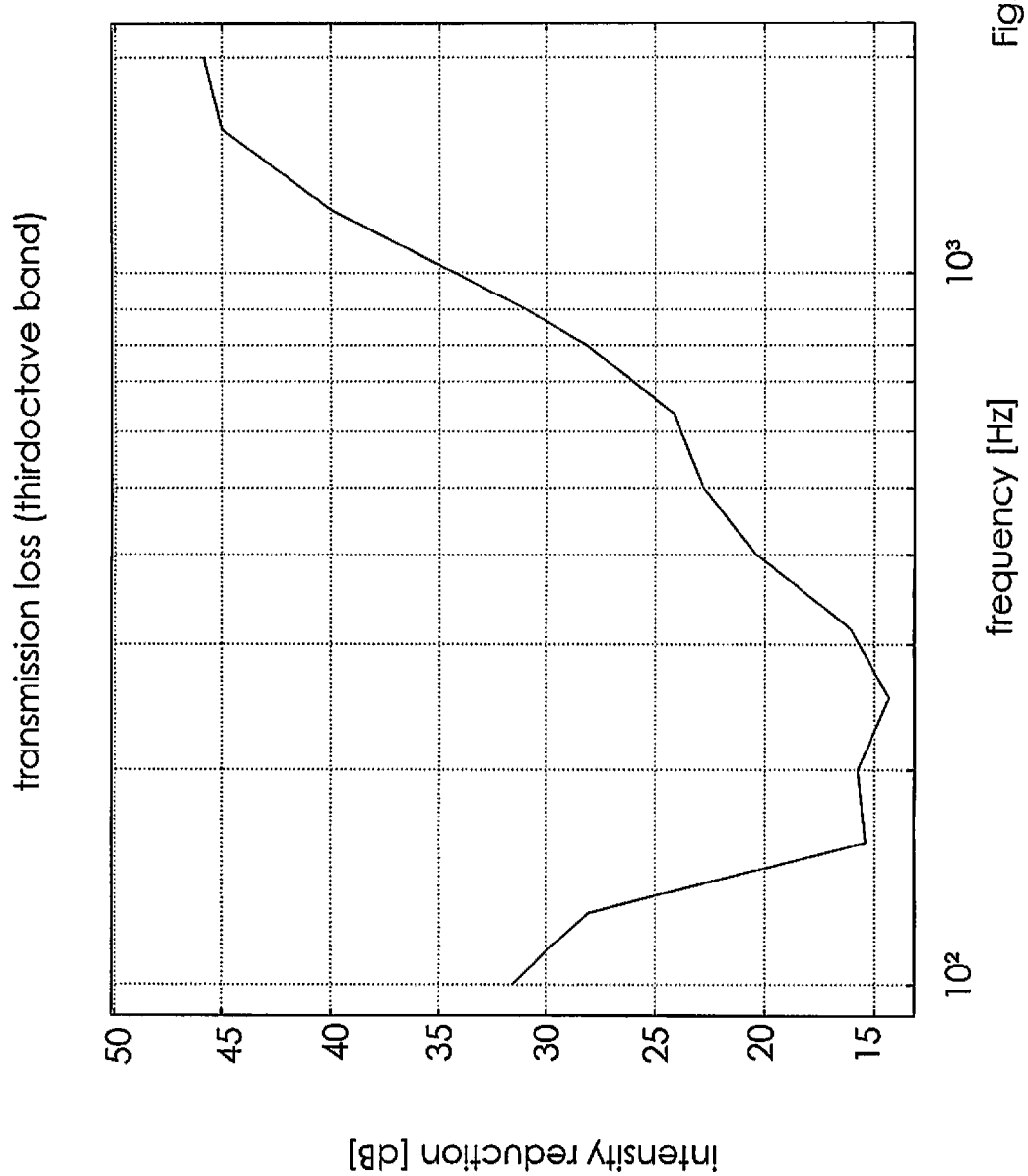
FIG. 10 shows a results diagram for the acoustic analysis.

In the third-octave band an exemplary curve profile over frequency, shown in FIG. 10, ensues for the sound reduction index R, with the aid of which the structural design of the fuselage shell 2 can be acoustically assessed. The outputted curves are particularly suitable for purposes of comparing fuselage shells 2 of different design (e.g. stiffener separation, layer structure, etc) and for the establishment of shell-related distinctive features.

Disclosed is a method for the acoustic analysis of a body, in particular a fuselage structure of an aircraft, with the steps:
  Input of data for the geometry, material, boundary conditions and acoustic parameters of the body, Generation of a body idealised in terms of its structural mechanics, and a cavity simulating the interior of the body, on the basis of the data inputted as a numerical body model, Registration of the geometry of the body with a pattern of nodes and the generation of finite elements, Simulation of an acoustic loading case by subjecting the body model to at least one sound pressure wave at a defined frequency, Analysis of the effect of the sound pressure wave on the body model, and Output of a sound reduction index (R) for the body with reference to that frequency.

Also disclosed is a system for the execution of a method of this type with a data input module, a geometry or nodes module, an elements module, a loads module, an analysis module and a results module.

REFERENCE SYMBOL LIST

1 System
2 Fuselage shell
4 Body model
6 Sound source
10 Generation and loading phase
11 Input module
12 Geometry or nodes module
13 Interface
14 Elements module
15 Documentation
16 Interface
17 Loads module
18 Connection
20 Calculation phase
21 Analysis module
30 Results phase
31 Results module

What is claimed is:

1. A method for performing acoustic analysis of a body, in particular of a fuselage structure of an aircraft, the method comprising:

inputting data for geometry, material, boundary conditions, and acoustic parameters of the body, the data including a definition of meshing of the geometry;

coordinating a fineness of a mesh with the boundary conditions and a defined frequency to be simulated;

generating a body model idealized in terms of its structural mechanics, and a cavity simulating a body interior, based on the data inputted as a numerical body model;

registering the geometry of the body with a pattern of nodes and a generation of finite elements;

simulating an acoustic loading case by subjecting the body model to at least one sound pressure wave at the defined frequency;

analyzing effects of the at least one sound pressure wave on the body model; and outputting a sound reduction index (R) for the body with reference to the defined frequency;

wherein the data inputted is automatically checked and a plurality of reports are continuously generated, as the body model is being generated, to form a quality management system based on the plurality of reports, and wherein the plurality of reports include numerical and geometric characteristics of the body model.

2. The method in accordance with claim 1, wherein the fuselage structure is subjected to a sound field of a defined frequency band from a multiplicity of sound sources, each of which transmits a sound pressure wave at one frequency, and which are arranged spherically at random angles around the body model.

3. The method according to claim 1, wherein parameters such as body radius, wall thickness, types of stiffening elements, and their orientation, dimensions, and separation distances from one another are inputted as geometric data.

4. The method in accordance with claim 1, wherein parameters such as type, density, stiffnesses, layer thickness and composite structure are inputted as material data.

5. The method in accordance with claim 1, wherein, as acoustic data parameters are defined for the cavity, which represents air in the body interior, characteristic values for the atmosphere external to the body, characteristic values for insulation material, a frequency bandwidth for which the sound reduction index (R) is to be determined, a number and distances of sound sources from the body model, and a distance from the body model to a point in the cavity at which evaluation of sound transmission is undertaken.

6. The method in accordance with claim 1, wherein the acoustic analysis is undertaken as a direct frequency response calculation.

7. The method in accordance with claim 1, wherein the sound reduction index (R) is determined based on a ratio of an incident sound intensity distribution ($J_1$) on the body to radiated sound intensity distribution in the cavity.

8. The method in accordance with claim 1, wherein at least one report of the plurality of reports is issued for purposes of a static assessment, which contains data such as, mechanical properties of the body, as well as numerical and geometric characteristic values of the body model.

9. A system for the execution of the method for executing acoustic analysis of a body, comprising:

a processor; and
a memory including instructions that, when executed by the processor, cause the system to:

input data for geometry, material, boundary conditions, and acoustic parameters of the body, the data including a definition of meshing of the geometry;

coordinating a fineness of a mesh with the boundary conditions and a defined frequency to be simulated;

generate a body model idealized in terms of its structural mechanics and a cavity simulating a body interior, based on the data inputted as a numerical body model;

register the geometry of the body with a pattern of nodes and a generation of finite elements;

simulate an acoustic loading case;

analyze effects of the at least one sound pressure wave on the body model; and output a sound reduction index (R) for the body with reference to the defined frequency, wherein the data inputted is automatically checked and a plurality of reports are continuously generated, as the body model is being generated, to form a quality management system based on the plurality of reports, and wherein the plurality of reports include numerical and geometric characteristics of the body model.

10. The method in accordance with claim 1, wherein during the registering of the geometry of the body, an algorithm is used for ensuring geometric compatibility such that if the algorithm detects a geometric incompatibility, the method is terminated and an error is described on a quality report in one of the plurality of reports.

* * * * *